(12) United States Patent
Dishongh et al.

(10) Patent No.: US 7,122,891 B2
(45) Date of Patent: Oct. 17, 2006

(54) CERAMIC EMBEDDED WIRELESS ANTENNA

(75) Inventors: Terrance Dishongh, Portland, OR (US); Weston C. Roth, Hillsboro, OR (US); Damion T. Searls, Hillsboro, OR (US); Tom E. Pearson, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 116 days.

(21) Appl. No.: 10/746,462

(22) Filed: Dec. 23, 2003

(65) Prior Publication Data

US 2005/0134507 A1    Jun. 23, 2005

(51) Int. Cl.
*H01L 23/12* (2006.01)
*H01L 21/8238* (2006.01)
(52) U.S. Cl. .............................. 257/700; 343/700 MS
(58) Field of Classification Search ................ 257/700, 257/703, 705, 707, 720; 156/89.11, 89.12, 156/89.16, 89.17, 153; 343/700 MS, 904, 343/907
See application file for complete search history.

(56) References Cited

U.S. PATENT DOCUMENTS

| 6,284,080 B1 * | 9/2001 | Haq et al. ................ 156/89.16 |
| 6,556,169 B1 * | 4/2003 | Fukuura et al. ...... 343/700 MS |
| 6,582,979 B1 | 6/2003 | Coccioli et al. |
| 6,770,159 B1 * | 8/2004 | Tebbe et al. ............. 156/89.11 |
| 6,784,765 B1 * | 8/2004 | Yamada et al. ............. 333/193 |
| 2004/0257279 A1 * | 12/2004 | Tebbe et al. ......... 343/700 MS |

OTHER PUBLICATIONS

W. Kinzy Jones et al., "Enhanced Thermal Conductivity in Low Temperature Cofire Ceramic (LTCC) Using Thick Silver Tape," Proceedings of IPACK '01, The Pacific Rim/ASME International Electronic Packaging.
Technical Conference and Exhibition, Jul. 8-13, 2001, pp. 1-8, Kauai, Hawaii, USA, Ref. No. IPACK2001-15698.

* cited by examiner

*Primary Examiner*—Shih-Chao Chen
*Assistant Examiner*—Minh Dieu A
(74) *Attorney, Agent, or Firm*—Robert G. Winkle

(57) ABSTRACT

Apparatus and methods of fabricating antennae embedded within a ceramic material, such as a low temperature co-fired ceramic. Such ceramic material has a low coefficient of thermal expansion which reduces expansion and contraction stresses that can cause the signal transmission frequency to change and thereby affecting proper signal transmission.

16 Claims, 6 Drawing Sheets

CERAMIC EMBEDDED WIRELESS ANTENNA

BACKGROUND OF THE INVENTION

1. Field of the Invention

The present invention relates to wireless antennae and method of fabricating the same. In particular, the present invention relates to forming antennae embedded in ceramic materials, such as low temperature co-fired ceramic (LTCC) materials.

2. State of the Art

Higher performance, lower cost, increased miniaturization of integrated circuit components, and greater packaging density of integrated circuits are ongoing goals of the microelectronic industry. Although these are the goals of the microelectronic industry, increasing the complexity and speed of a microelectronic die generally increases its size, as well as increasing the number of signals being delivered to and sent from the microelectronic die. This increase in the number of signals naturally requires an increase in the number of signals lines. The increase in signals lines results in increasingly complex routing through the substrate or interposer to which the microelectronic die is attached. The interposer in turn is attached to a primary substrate upon which other microelectronic devices are attached.

With greater complexity of signal line routing, the proper timing of the transmission of information to and from the various microelectronic devices becomes more difficult, because the distances between the circuits become more varied. Naturally, this may adversely affect the performance of the microelectronic devices, as the varied distances may result in delays within the clock signal distribution. For optimal performance, common signals must reach each relevant microelectronic device substantially simultaneously and individual signals must be properly timed.

One solution to such issues is the use of radios to broadcast and receive signals, which, of course, bypasses the signal lines and results in simultaneous receipt and transmission of signals between microelectronic devices. These radios are naturally very small. This minute size results in the antennae of these radios being particularly susceptible to expansion and contraction due to the relatively high coefficients of thermal expansion ("CTE") of the materials within a microelectronic package in which the antennae are embedded or to which the antennae are attached. This expansion and contraction may cause the signal transmission and/or receipt frequency to change, which can affect proper signal transmission and/or receipt, as will be understood by those skilled in the art.

Therefore, it would be advantageous to develop apparatus and techniques to effectively isolate on-device antennae from the affects of CTE within a microelectronic package.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings to which:

DETAILED DESCRIPTION OF THE ILLUSTRATED EMBODIMENT

Figure 1:
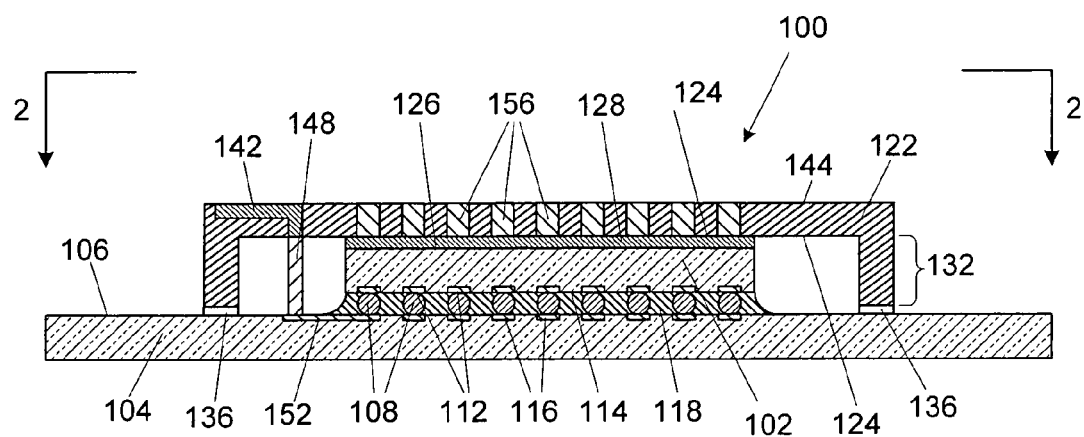
FIG. 1 is a side cross-sectional view of a microelectronic device assembly, according to the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

It should be understood that embodiments of the present invention may be used in a variety of applications. Although the present invention is not limited in this respect, the antenna assemblies disclosed herein may be used in many apparatuses, such as in the transmitters and receivers of a radio system, and may go beyond chip-to-chip communication to include chip-to-chip wireless communication systems which interconnect wireless local area networks (WLAN) devices and wireless wide area network (WWAN) devices including wireless network interface devices and network interface cards (NICs), base stations, access points (APs), gateways, bridges, hubs, cellular radiotelephone communication systems, satellite communication systems, two-way radio communication systems, one-way pagers, two-way pagers, personal communication systems (PCS), personal computers (PCs), personal digital assistants (PDAs), and the like, although the scope of the invention is not limited in this respect.

FIG. 1 illustrates a microelectronic device assembly 100 comprising a microelectronic die 102 (illustrated as a flip chip) physically and electrically attached to a first surface 106 of a substrate 104 (such as an interposer, a motherboard, or the like) by a plurality of conductive bumps 108, such as solder balls, conductive particle filled polymers, and the like, extending between pads 112 on an active surface 114 of the microelectronic die 102 and lands 116 on the substrate first surface 106. To mechanically and physically reinforce the conductive bumps 108 connecting the microelectronic die pads 112 and the substrate lands 116, an underfill material 118, such as an epoxy material, is disposed therebetween. The microelectronic die 102 may include, but is not limited to central processing units (CPUs), chipsets, memory devices, ASICs, and the like. It is, of course, understood that the external interconnects (not shown) may be disposed on a second surface 110 of the substrate 104, which opposes the substrate first surface 106, for connection with external substates and devices (not shown).

A heat dissipation device 122 is placed in thermal contact by a first surface 124 thereof with a back surface 126 of the microelectronic die 102. A thermal interface material 128 may be disposed between the heat dissipation device first surface 124 and the microelectronic die back surface 126 to improve thermal conductivity therebetween. The thermal interface material 128 should have high thermal conductivity and may include, but is not limited to, thermal grease, phase-change material, metal filled polymer matrix, solder (alloys of lead, tin, indium, silver, copper, and the like), and other such materials known in the art.

The heat dissipation device 122 may further include at least one stand-off 132, wherein the heat dissipation device 122 may be attached to the substrate first surface 106 by an adhesive layer 136 (generally a non-conductive polymer) between the substrate first surface 106 and the stand-off 132, which provides mechanical strength to the microelectronic device assembly 100.

Ordinarily, the heat dissipation device 122 would be constructed from a thermally conductive metal, such as copper, copper alloys, aluminum, aluminum alloys, and the like. However, in the present invention, the heat dissipation device 122 is formed from a thermally conductive ceramic material. An antenna 142 may be embedded in the ceramic heat dissipation device 122 proximate to a second surface 144 thereof with a conductive via 146 extending from the antenna 142 to the heat dissipation device first surface 124. The conductive via 146 is connected to a conductive pillar 148 extending from the conductive via 146 to an antenna signal trace 152 proximate the substrate first surface 106 to at least one conductive bump 108. Thus, the antenna 142 is in electrical communication with the microelectronic die 102. The antenna 142 and conductive via 146 may be made of any applicable electrically conductive material including but not limited to silver, gold, copper, aluminum, and the like.

Figure 3:
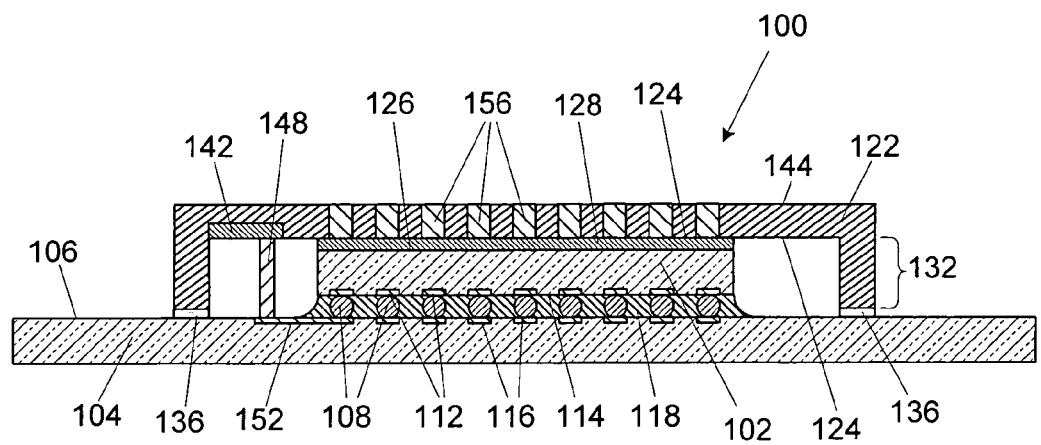
FIG. 3 is a side cross-sectional view of another microelectronic device assembly, according to the present invention.

Of course, it is understood that the antenna 142 may be fabricated to be disposed on the heat dissipation device first surface 124, thereby eliminating the need the conductive via 146, as shown in FIG. 3. It is understood by those skilled in art that the conductive pillar 148 may be attached by any means known in the art, including but not limited to the application of solder paste followed by solder reflow.

The ceramic materials used to fabricate the antenna-containing ceramic heat dissipation device 122 preferably, after firing, achieves a dense, non-porous microstructure below about 950° C. such that it can be co-fired with low resistance conductive materials such as gold, copper, and silver, commonly known as low temperature co-fired ceramic (LTCC) materials. These ceramic materials may include, but are not limited to calcium titanate, magnesium titanate, barium titanate, forsterite, magnesium calcium titanate, 951 Green Tape™, available from DuPont Corporation, Wilmington, Del., USA, and the like. The ceramic materials (after being fired), preferably have a low CTE, which is about that of silicon or gallium arsenide. Thus, with low CTE, embedding the antenna 142 in the ceramic heat dissipation device 122 will greatly diminish frequency fluctuations caused by expansion and contraction.

Figure 2:
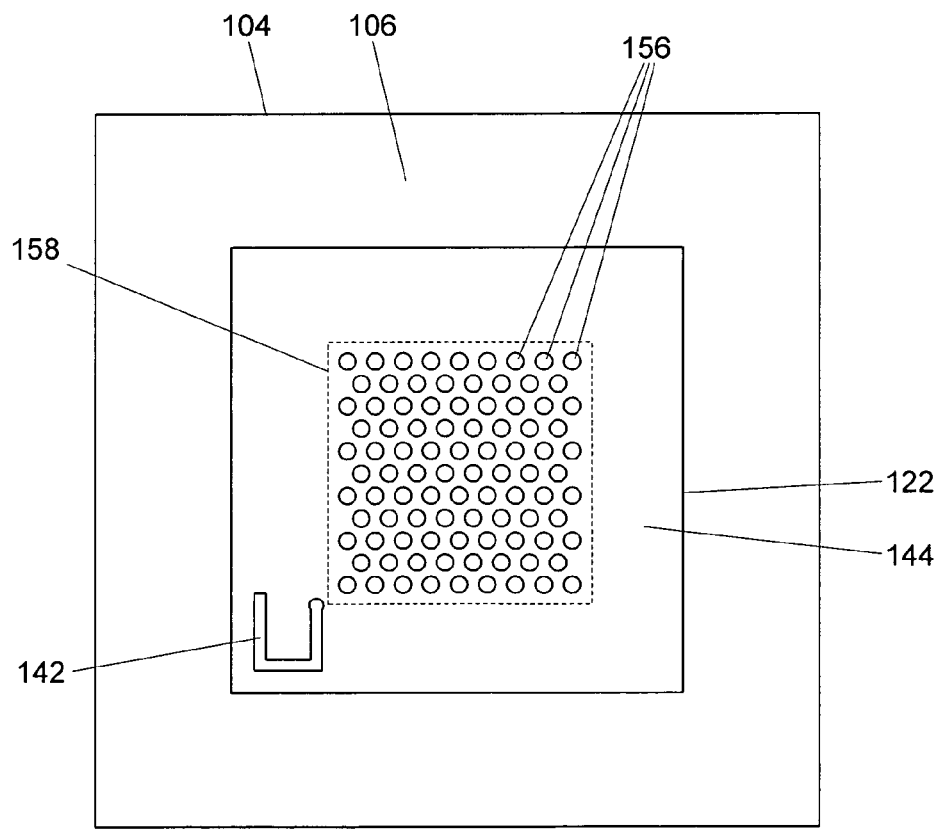
FIG. 2 is a top plan view of the microelectronic device assembly along lines 2—2 of FIG. 1, according to the present invention.

Furthermore, as is known in the art, the thermal properties of the antenna-containing ceramic heat dissipation device 122 can enhanced by forming thermal vias 156 through the antenna-containing ceramic heat dissipation device 122 from the heat dissipation device first surface 124 and the heat dissipation device second surface 144 proximate the microelectronic die 102, as shown in FIGS. 1 and 2 (wherein dashed line 158 shows the position of microelectronic die 102 in FIG. 2). The thermal vias 156 can be, but is not limited to, metal plugs, heat pipes, and the like. Moreover, the antenna-containing ceramic heat dissipation device 122 may include, high surface area (e.g., finned) structures, and may include a heat pipe, thermoelectric coolers, and cold plates (refrigeration or liquid cooled) attached to the heat dissipation device second surface 144.

Figure 4:
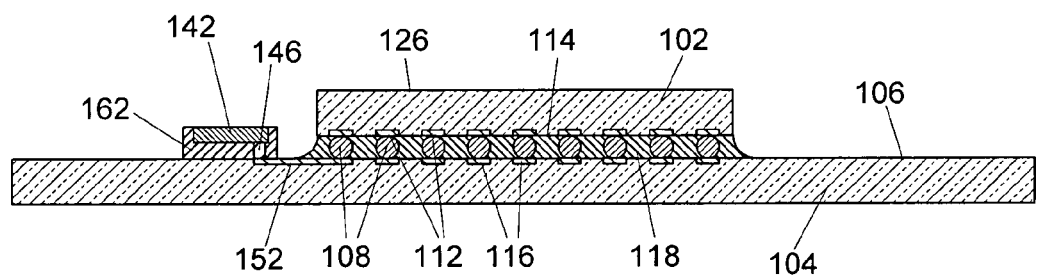
FIG. 4 is a side cross-sectional view of yet another microelectronic device assembly, according to the present invention.
Figure 5:
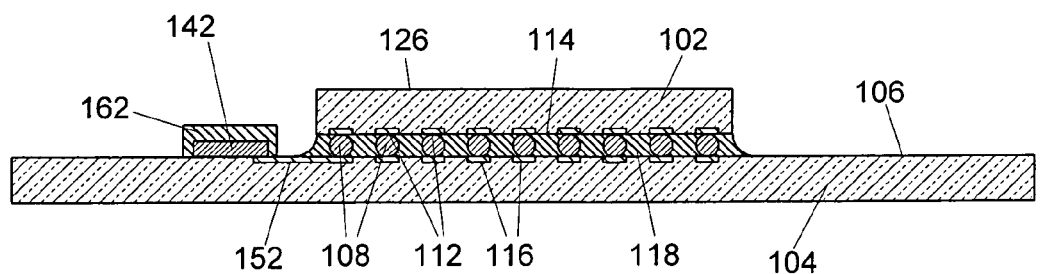
FIG. 5 is a side cross-sectional view of still another microelectronic device assembly, according to the present invention.

It is, of course, understood that the antenna 142 need not be embedded in a heat dissipation device 122. The antenna 142 may be itself embedded alone in a ceramic material 162 in its own antenna package 160, as shown in FIGS. 4 and 5. The antenna package 160 may be attached to the substrate 104 either with the antenna 142 facing the substrate first surface 106 and be attached directly to the antenna signal trace 152, as shown in FIG. 4, or may be attached with the antenna 142 opposing the substrate first surface 106, which includes the conductive via 146 that is attached directly to the antenna signal trace 152, as shown in FIG. 5.

Figure 6:
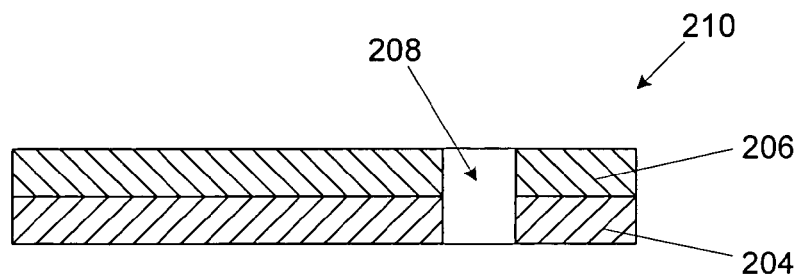
FIGS. 6–9 illustrate a method of fabricating a ceramic embedded antenna, according to the present invention.

FIGS. 6–9 illustrate one embodiment of a method of fabrication of an antenna package of the present invention. As shown in FIG. 6, a green (unfired) ceramic layer, such as the 951 Green Tape™ with a 5 mil thickness, is sized and layered (shown as a first green ceramic layer 204 and a second green ceramic layer 206) to a desired thickness to form an initial lay-up 210. The initial lay-up 210 may have a conductive via opening 208 extending therethrough. The conductive via opening 208 may be formed, by any known method, after layering the individual green ceramic layer, or may be preformed in each individual green ceramic layer and aligned during layering, as will be understood to those skilled in the art.

Figure 7:
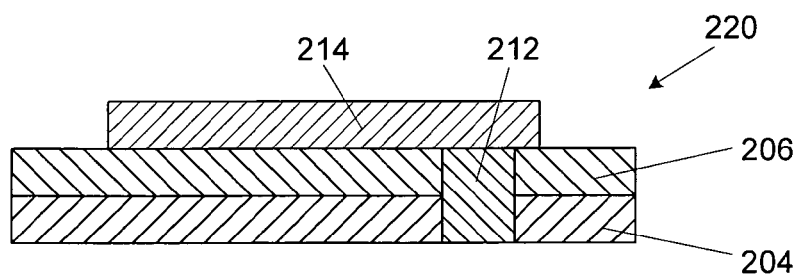
Figure 8:
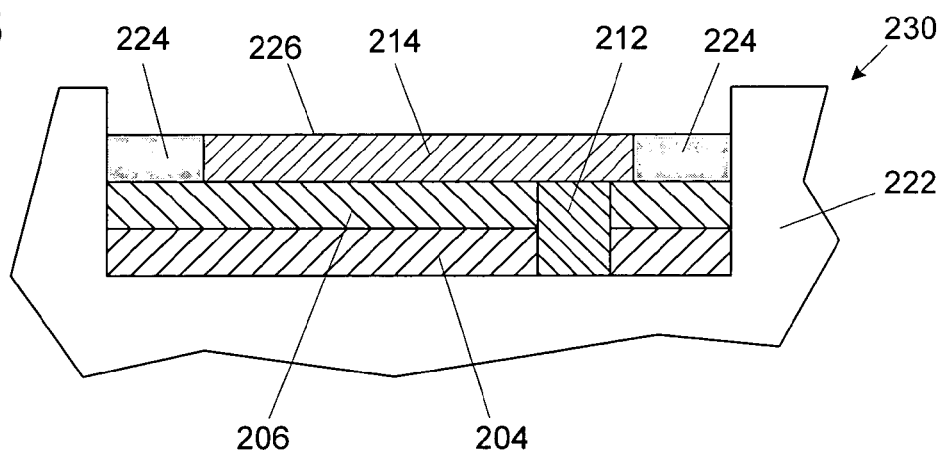

As shown in FIG. 7, a conductive material 212 may be dispensed within the conductive via opening 208, and an antenna 214 is disposed on the initial lay-up 210 to form an intermediate lay-up 220. The conductive material 212 may include, but is not limited to, metal and metal-filled polymers, and may include 6141 Ag Via Fill Conductor, available from DuPont Corporation, Wilmington, Del., USA. The antenna 214 may be a preformed structure placed on the initial lay-up 210, a conductive paste disposed on the initial lay-up 210, a structure formed by patterning and deposition on the initial lay-up 210, or the like, as will be understood to those skill in the art. As shown in FIG. 8, the initial lay-up 210 and intermediate lay-up 220 may be formed in a cast 222, or the intermediate lay-up 220 may be placed in the cast 222. Once in the cast 222, an unfired, powdered ceramic 224, such as calcium titanate, magnesium titanate, barium titanate, forsterite, magnesium calcium titanate, powdered 951 Green Tape™, available from DuPont Corporation, Wilmington, Del., USA, and the like, is dispensed on the intermediate lay-up 220, preferably to a level substantially even with an upper surface 226 of the antenna 214, such that the antenna upper surface 226 is not covered with the unfired, powdered ceramic 224, to form the final lay-up 230.

Figure 9:
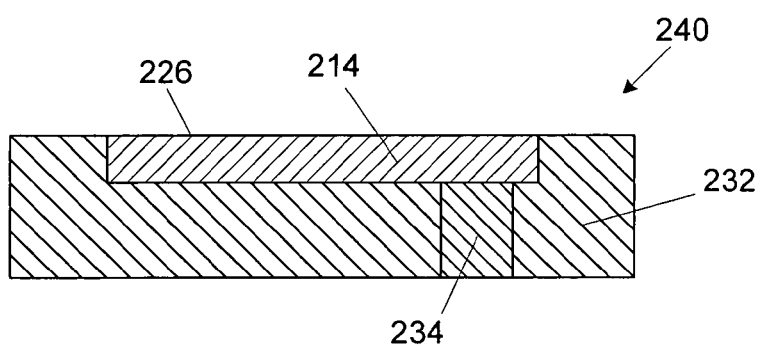

As shown in FIG. 9, the final lay-up 230 is then fired at a temperature of about 850° C. to form a substantially contiguous ceramic structure 232 binding all but the antenna upper surface 226 and to form a conductive via 234 from the conductive material 212 (see FIG. 7). Thus, an antenna package 240, similar to the antenna package 160 of FIG. 5, is formed. An antenna package, similar to the antenna package 160 of FIG. 4, is fabricated in the same manner as described in FIGS. 6–9 with the exception that no conductive via opening 208 or formation of the conductive via 234 is necessary.

Figure 10:
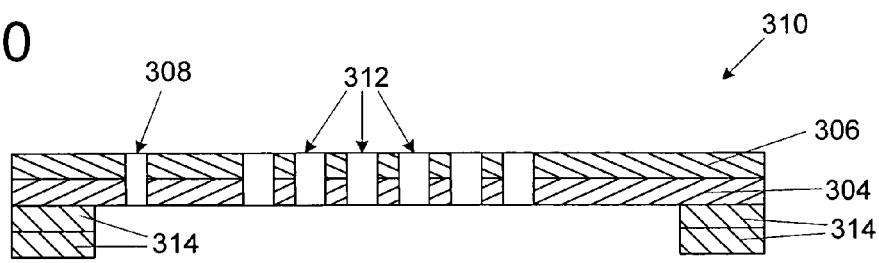
FIGS. 10–13 illustrate a method of fabricating an antenna containing heat dissipation device, according to the present invention.

FIGS. 10–14 illustrates one embodiment of a method of fabrication of an antenna-containing heat dissipation device of the present invention. As shown in FIG. 10, a green (unfired) ceramic layer, such as the 951 Green Tape™ with a 5 mil thickness, is sized and layered (shown as a first green ceramic layer 304 and a second green ceramic layer 306) to a desired thickness to form an initial lay-up 310. The initial lay-up 310 may have a conductive via opening 308 and a plurality of thermal via openings 312 extending therethrough. The conductive via opening 308 and the thermal via openings 312 may be formed after layering the individual green ceramic tape layer, or may be preformed in each individual green ceramic tape layer and aligned during layering, as will be understood to those skilled in the art. Pre-shaped green ceramic tape layers 314 are layered horizontally (shown) or vertically to form stand-offs 316.

Figure 11:
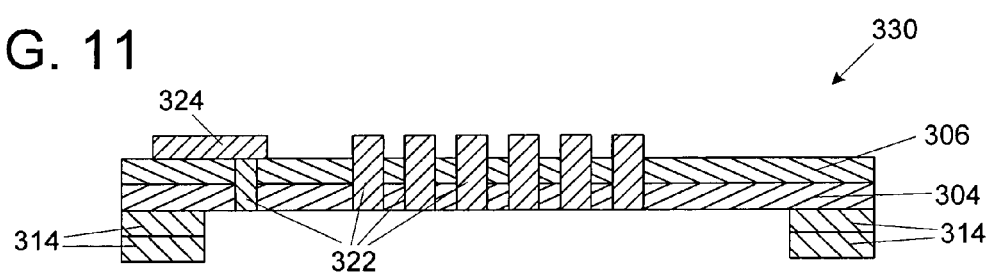
Figure 12:
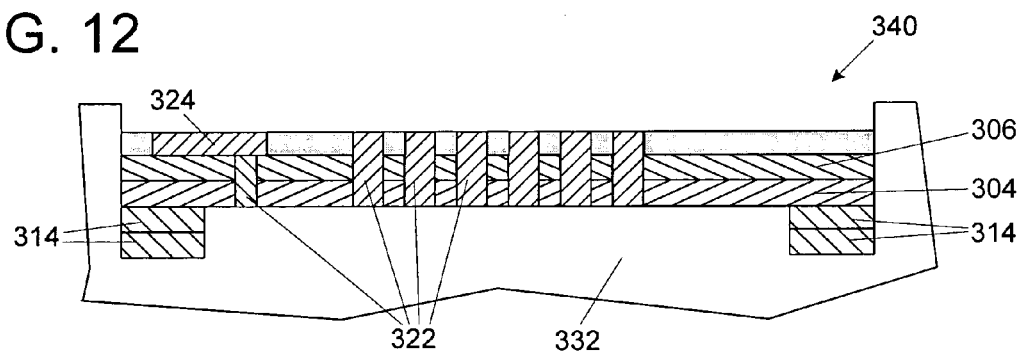

As shown in FIG. 11, a conductive material 322, such as 6141 Ag Via Fill Conductor, available from DuPont Corporation, Wilmington, Del., USA, may be dispensed within the conductive via opening 308 and the thermal via openings 312, and an antenna 324 is disposed on the initial lay-up 310 to form an intermediate lay-up 330. The antenna 324 may be a preformed structure placed on the initial lay-up 310, a conductive paste disposed on the initial lay-up 310, a structure formed by patterning and deposition on the initial lay-up 310, or the like, as will be understood to those skill in the art. As shown in FIG. 12, the initial lay-up 310 and intermediate lay-up 330 may be formed in a cast 332, or the intermediate lay-up 330 may be placed in the cast 332. Once in the cast 332, an unfired, powdered ceramic 334 is dispensed on the intermediate lay-up 330, preferably to a level substantially even with an upper surface 336 of the antenna 324, such that the antenna upper surface 336 is not covered with the unfired, powdered ceramic 334, to form the final lay-up 340.

Figure 13:
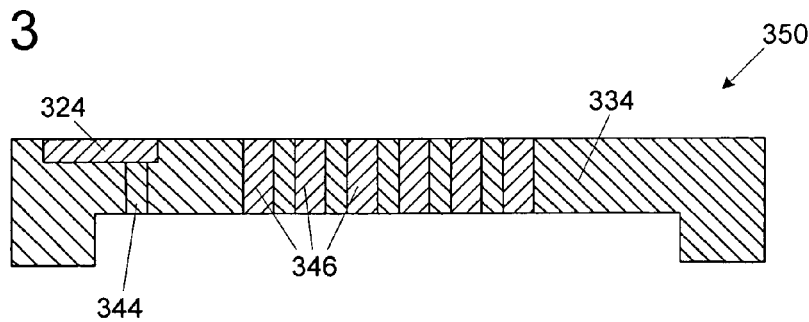

As shown in FIG. 13, the final lay-up 340 is then fired at a temperature of about 850° C. to form a substantially contiguous ceramic structure 342 binding all but the antenna upper surface 336 and to form a conductive via 344 and thermal vias 346 from the conductive material 322 (see FIG. 7). Thus, an antenna-containing ceramic heat dissipation device 350, similar to the antenna-containing heat dissipation device 122 of FIG. 1, is formed.

Figure 14:
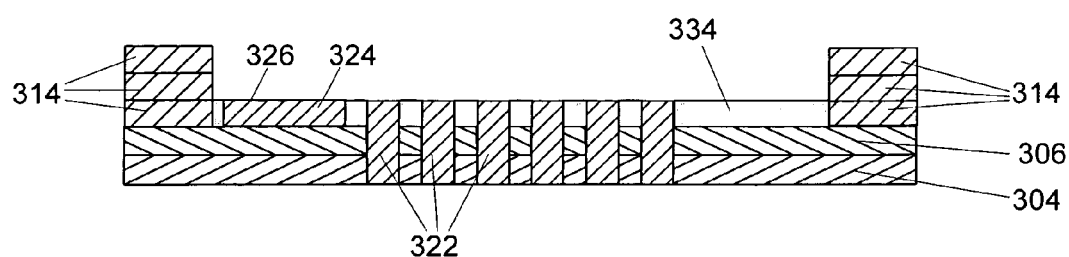
FIGS. 14 and 15 illustrate a method of fabricating another antenna containing heat dissipation device, according to the present invention.
Figure 15:
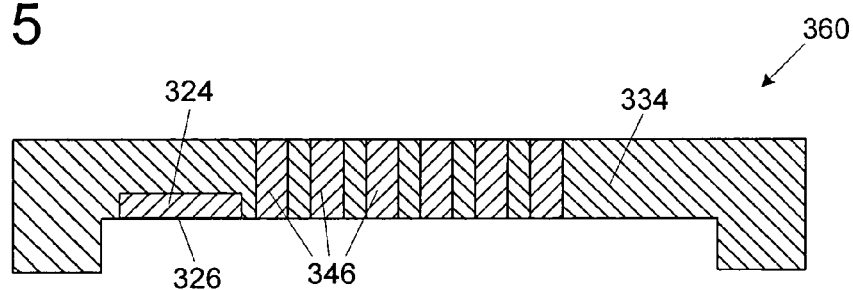

As shown in FIGS. 14 and 15, an antenna-containing ceramic heat dissipation device 360 (see FIG. 15), similar to the antenna-containing ceramic heat dissipation device 122 of FIG. 3, is fabricated in the same manner as described in FIGS. 6–9 with the exception that no conductive via opening 308 or formation of the conductive via 344 is necessary and different positioning of the antenna 324 and the stand-offs 316. Additionally, if the stand-offs 316 completely surrounds the periphery of the heat dissipation device, no cast is needed to contain the powdered ceramic material 334 as it will be contained by the stand-offs 316, as shown in FIG. 15. The structure is then fired to form the antenna-containing ceramic heat dissipation device 360, as shown in FIG. 16.

Figure 16:
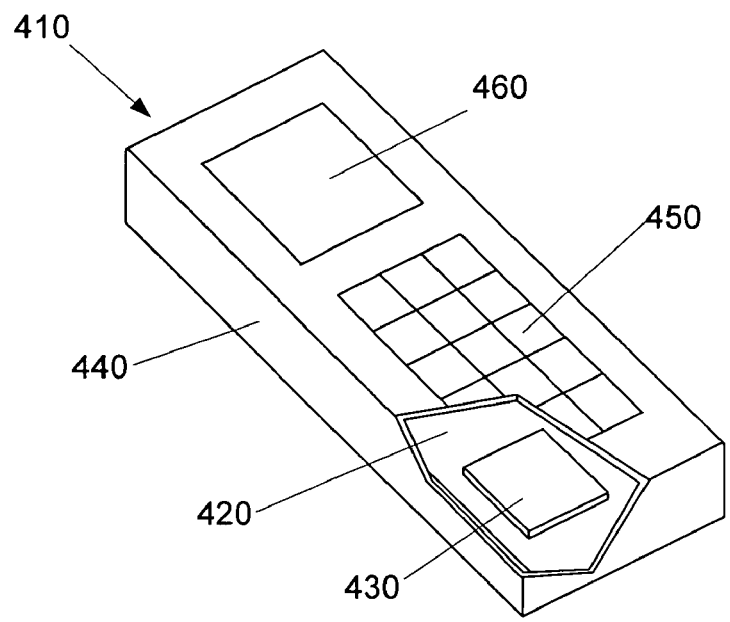
FIG. 16 is an oblique view of a hand-held device having a microelectronic assembly of the present integrated therein, according to the present invention.

The packages formed by the present invention may be used in a hand-held device 410, such as a cell phone or a personal data assistant (PDA), as shown in FIG. 16. The hand-held device 410 may comprise an external substrate 420 with at least one of the microelectronic device assembly 100 of FIG. 1 or FIG. 2 and the assemblies of FIG. 4 or FIG. 5 collectively represented as element 430 attached thereto, within a housing 440. The external substrate 420 may be attached to various peripheral devices including an input device, such as keypad 450, and a display device, such an LCD display 460.

Figure 17:
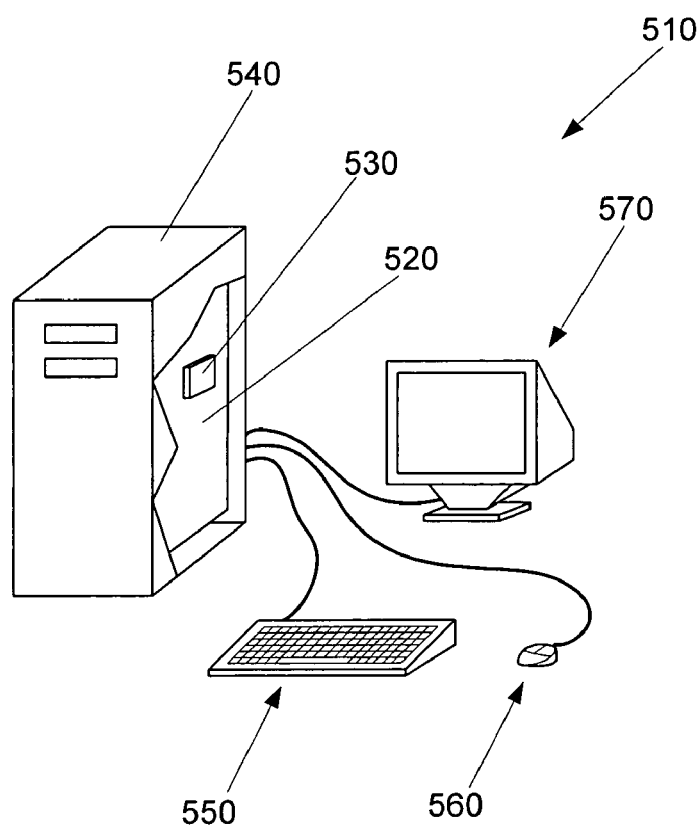
FIG. 17 is an oblique view of a computer system having a microelectronic assembly of the present integrated therein, according to the present invention.

The microelectronic device assemblies formed by the present invention may also be used in a computer system 510, as shown in FIG. 17. The computer system 510 may comprise an external substrate or motherboard 520 with at least one of the microelectronic device assembly 100 of FIG. 1 or FIG. 2 and the assemblies of FIG. 4 or FIG. 5 collectively represented as element 530 attached thereto, within a housing or chassis 540. The external substrate or motherboard 420 may be attached to various peripheral devices including inputs devices, such as a keyboard 550 and/or a mouse 560, and a display device, such as a CRT monitor 570.

Having thus described in detail embodiments of the present invention, it is understood that the invention defined by the appended claims not to be limited by particular details set forth in the above description, as many apparent variations thereof are possible without departing from the spirit or scope thereof.

What is claimed is:

1. A method of fabricating an antenna package, comprising:
   providing at least one unfired ceramic layer;
   disposing an antenna on said unfired ceramic layer;
   disposing an unfired, powder ceramic material adjacent said antenna, wherein a top surface of the antenna substantially free of said unfired ceramic material; and
   firing said unfired ceramic layer and said unfired ceramic material.

2. The method of claim 1, wherein providing said at least one unfired ceramic layer comprises providing at least one layer of an unfired ceramic tape.

3. The method of claim 1, wherein providing said at least one unfired ceramic layer comprises providing at least one unfired ceramic layer selected from the group comprising calcium titanate, magnesium titanate, barium titanate, forsterite, and magnesium calcium titanate.

4. The method of claim 1, wherein said disposing an unfired, powder ceramic material comprises disposing an unfired, powder ceramic layer selected from the group comprising calcium titanate, magnesium titanate, barium titanate, forsterite, and magnesium calcium titanate.

5. The method of claim 1, further comprising providing at least one conductive via contacting said antenna through said at least one unfired ceramic layer.

6. A method of fabricating an antenna-containing heat dissipation device, comprising:
   providing at least one unfired ceramic layer having a first surface and a second surface;

disposing an antenna on one of said unfired ceramic layer first surface and said unfired ceramic layer second surface;

disposing an unfired, powder ceramic material adjacent said antenna, wherein a top surface of the antenna substantially free of said unfired ceramic material;

forming at least one thermal via through said at last one unfired ceramic layer and said unfired, powder ceramic material; and firing said unfired ceramic layer and said unfired ceramic material.

7. The method of claim 6, wherein providing said at least one unfired ceramic layer comprises providing at least one layer of an unfired ceramic tape.

8. The method of claim 6, wherein providing said at least one unfired ceramic layer comprises providing at least one unfired ceramic layer selected from the group comprising calcium titanate, magnesium titanate, barium titanate, forsterite, and magnesium calcium titanate.

9. The method of claim 6, wherein said disposing an unfired, powder ceramic material comprises disposing an unfired, powder ceramic layer selected from the group comprising calcium titanate, magnesium titanate, barium titanate, forsterite, and magnesium calcium titanate.

10. The method of claim 6, further comprising providing at least one conductive via extending through said at least one unfired ceramic layer and contacting said antenna.

11. The method of claim 6, further comprising disposing a stand-off on said at least one of said providing at least one conductive via extending through said at least one unfired ceramic layer and contacting said antenna.

12. A microelectronic device assembly, comprising:
a microelectronic die having an active surface and a back surface;
a substrate having a first surface, wherein said microelectronic die is attached to said substrate first surface by said microelectronic die active surface; and
an antenna package attached to said substrate and in electrical contact with said microelectronic die, comprising,
an antenna having a top surface; and
a ceramic material surrounding at least a portion of said antenna, wherein said antenna top surface is substantially free of said ceramic material.

13. The microelectronic device assembly of claim 12, wherein said antenna top surface is in electrical contact with the microelectronic die.

14. The microelectronic device assembly of claim 12, further including at least one conductive via contacting said antenna through said ceramic material, and wherein said at least one conductive via is in electrical contact with the microelectronic die.

15. A microelectronic device assembly, comprising:
a microelectronic die having an active surface and a back surface;
a substrate having a first surface, wherein said microelectronic die is attached to said substrate first surface by said microelectronic die active surface; and
an antenna-containing heat dissipation device abutting said microelectronic die back surface, comprising:
an antenna having a top surface, wherein said antenna is in electronic contact with said microelectronic die;
a ceramic material surrounding at least a portion of said antenna, wherein said antenna top surface is substantially free of said ceramic material; and
at least one thermal via extending through said ceramic material.

16. The microelectronic device assembly of claim 15, whether said antenna-containing heat dissipation device further includes a stand-off attached to said substrate.

* * * * *